United States Patent [19]

Prinz

[11] Patent Number: 5,661,062
[45] Date of Patent: Aug. 26, 1997

[54] ULTRA HIGH DENSITY, NON-VOLATILE FERROMAGNETIC RANDOM ACCESS MEMORY

[75] Inventor: Gary A. Prinz, Alexandria, Va.

[73] Assignee: The United States of America as represented by the Secretary of the Navy, Washington, D.C.

[21] Appl. No.: 430,048

[22] Filed: Apr. 27, 1995

Related U.S. Application Data

[62] Division of Ser. No. 130,479, Oct. 1, 1993.

[51] Int. Cl.$^6$ ............................................. H01L 21/312
[52] U.S. Cl. ........................................................... 438/3
[58] Field of Search .............................. 437/52, 228, 229, 437/944; 428/672; 365/173; 156/659.1

[56] References Cited

U.S. PATENT DOCUMENTS

| | | | |
|---|---|---|---|
| 4,604,176 | 8/1986 | Paul | 427/128 |
| 5,064,499 | 11/1991 | Fryer | 437/228 |
| 5,389,566 | 2/1995 | Lage | 437/52 |

OTHER PUBLICATIONS

H.J. Kump et al. "Coupled NDRO Magnetic Film Memory" IBM TDB vol.13, No. 7 Dec. 1970 pp.2110–2111.

Thompson et al., "Thin Magnetoresistors in memory, shorage, and Related applications" IEEE Trans. On Magnetics IIC4, 1039–50 Jul. 1975.

Binasch et al. "Enhanced Magnetoresistance In Layered Magnetic Structures With Antiferromagnetic Interlayer Exchange" Physical Rev. B. 39C7, 4828–30, Mar. 1, 1989.

*Primary Examiner*—Tom Thomas
*Attorney, Agent, or Firm*—Thomas E. McDonnell; Barry A. Edelberg

[57] ABSTRACT

A random access memory element utilizes giant magnetoresistance. The element includes at least one pair of ferromagnetic layers sandwiching a nonmagnetic conductive layer. At least one of the two ferromagnetic layers has a magnetic moment oriented within its own plane. The magnetic moment of at least the first ferromagnetic layer of the pair has its magnetic moment oriented within its own plane and is typically fixed in direction during use. The second ferromagnetic layer of the pair has a magnetic moment which has at least two preferred directions of orientation. These preferred directions of orientation may or may not reside within the plane of the second ferromagnetic layer. The bit of the memory element may be set by applying to the element a magnetic field which orients the magnetic moment of the second ferromagnetic layer in one or the other of these preferred orientations. Once the bit is set, the value of the determined by the relative alignment of the magnetic moments of the first and second ferromagnetic layers. This value may be read by applying an interrogating current across the memory element, perpendicular to the plane within which the magnetic moment of the first ferromagnetic layer is oriented, and observing the variation in resistance. These ferromagnetic elements may be fabricated using conventional photolithography. Groups of these ferromagnetic element may be organized into word trees and other arrays.

5 Claims, 7 Drawing Sheets

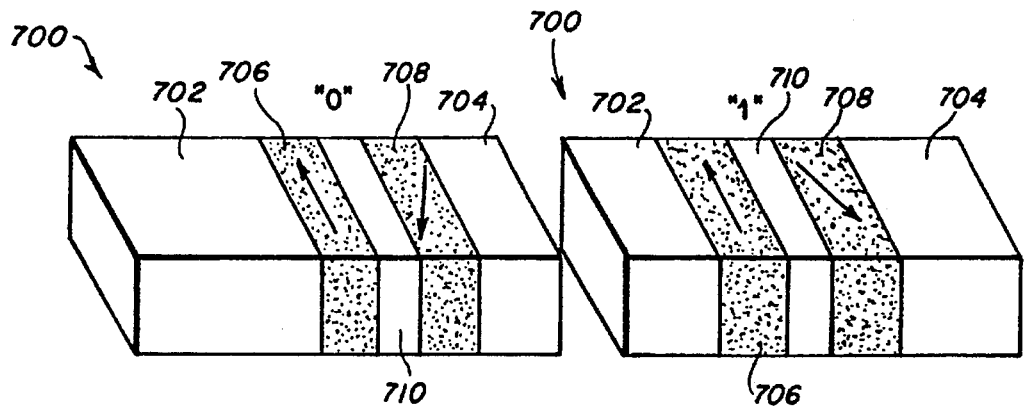
FIG. 14a  FIG. 14b
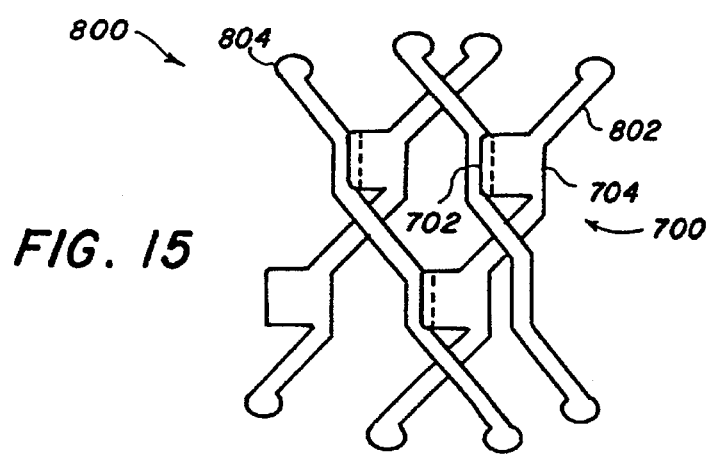
FIG. 15
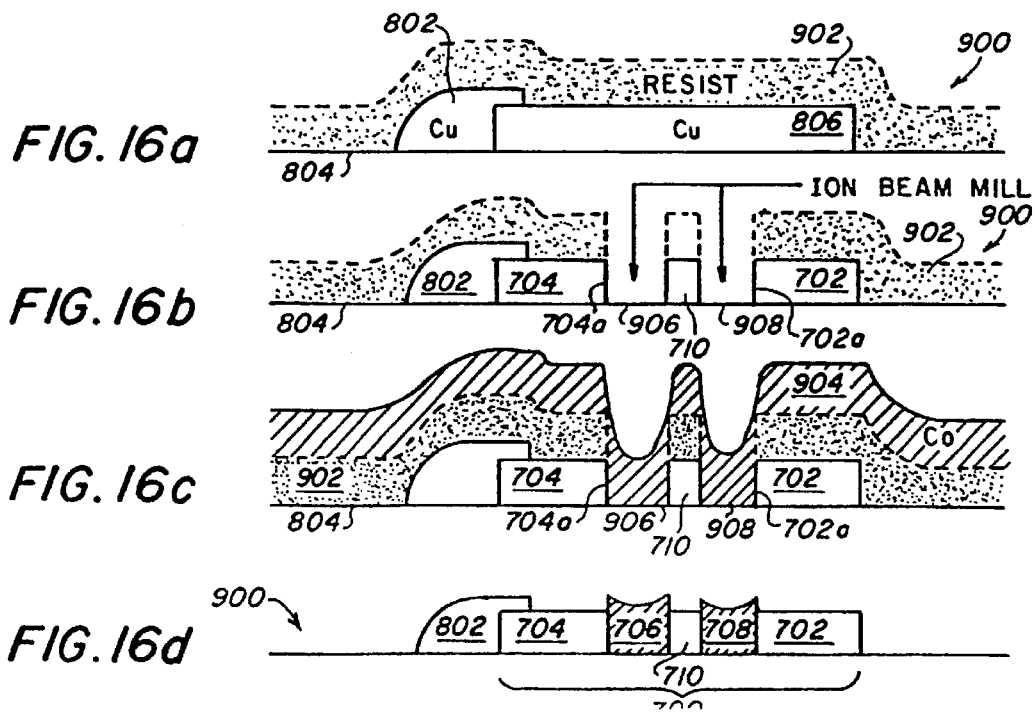
FIG. 16a
FIG. 16b
FIG. 16c
FIG. 16d

ULTRA HIGH DENSITY, NON-VOLATILE FERROMAGNETIC RANDOM ACCESS MEMORY

This is a division of copending application Ser. No. 08/130,479, filed Oct. 1, 1993, to Gary A. Prinz, titled ULTRA HIGH DENSITY, NON-VOLATILE FERROMAGNETIC RANDOM ACCESS MEMORY.

BACKGROUND OF THE INVENTION

1. Field of the Invention

The present invention relates generally to ferromagnetic memory and more specifically to ferromagnetic memory utilizing giant magnetoresistance and spin polarization.

2. Description of the Background Art

For many years, random access memory for computers was constructed from magnetic elements. This memory had the advantage of very high reliability, nonvolatility in the event of power loss and infinite lifetime under use. Since this memory was hand assembled from three-dimensional ferrite elements, it was eventually supplanted by planar arrays of semiconductor elements. Planar arrays of semiconductors can be fabricated by lithography at a much lower cost than the cost of fabricating prior art magnetic ferrite memory elements. Additionally, these semiconductor arrays are more compact and faster than prior art ferrite magnetic memory elements. Future benefits of increasingly smaller scale in semiconductor memory are now jeopardized by the concern of loss of reliability, since very small scale semiconductor elements are not electrically robust.

Non-volatile magnetic memory elements that are read by measuring resistance have been previously demonstrated by Honeywell Corporation. These systems operate on the basis of the classical anisotropic magneto-resistance phenomena, which results in resistance differences when the magnetization is oriented perpendicular versus parallel to the current. Previous work by others has shown that a 2% change in resistance is sufficient to permit the fabrication of memory arrays compatible with existing CMOS computer electronics. Unfortunately, scaling of these elements down from the current 1 μm size has proved challenging.

SUMMARY OF THE INVENTION

Accordingly, it is an object of this invention to produce an inexpensive non-volatile random access ferromagnetic memory.

It is another object of the present invention to produce a non-volatile ferromagnetic random access memory that is faster than the presently available semiconductor random access memory.

It is a further object of the present invention to produce a highly compact non-volatile random access ferromagnetic memory.

These and additional objects of the invention are accomplished by a non-volatile random access memory element that employs giant magnetoresistance (GMR), i.e., the spin-valve effect. The memory element has a sandwich structure in which layers of ferromagnetic material, at least one of which has its magnetic moment oriented within the plane of the layer, are spaced apart by a layer of a non-magnetic metal. Conducting leads provide current to pass through the ferromagnetic layers, perpendicular to the magnetic moment of the at least one ferromagnetic layer having its magnetic moment oriented within the plane of the ferromagnetic layer. Between and in physical contact with one of the ferromagnetic layers and the conducting leads there may be an antiferromagnetic layer. The antiferromagnetic layer fixes the direction and magnitude of the magnetic moment of the ferromagnetic layer that it contacts.

When a voltage is applied across the two ferromagnetic layers, the resistance varies depending upon whether the magnetic moments of these layers are aligned in the same direction with respect to each other. Resistance between the two layers increases when the magnetic moments of these two ferromagnetic layers are not aligned in the same direction, i.e., misaligned or anti-parallel (anti-aligned). The resistance between the two layers drops when the magnetic moments of these two ferromagnetic layers are in essentially the same direction (parallel) or move from a more anti-parallel orientation to one which is more parallel. The more parallel state can be assigned a value of "0" or "1" while the more antiparallel state can be assigned, respectively, a value of "1" or "0". Thus, the alignment status of each memory element according to the present invention represents a bit of information.

The bit can be altered in a memory element according to the present invention by applying an sufficiently high current in the conducting leads in order to generate a magnetic field sufficient to align, in one direction, the magnetic moment of any unpinned ferromagnetic layer along one of the easy directions of orientation. The direction of orientation favored by the orienting current is of course determined by the polarity of that orienting current. Once set, the bit may be read by applying a smaller current through the appropriate conducting leads and determining whether the resistance is more or less than that of a reference resistance.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein:

FIGS. 14a and 14b show a planar striped non-volatile random access memory element according to the present invention, in two different "at rest" configurations.

FIG. 15 shows an array of planar striped non-volatile random access memory elements according to FIG. 14.

FIGS. 16a, 16b, 16c and 16d are a series of Figures illustrating the fabrication and a non-volatile random access memory element according to the present invention.

DESCRIPTION OF THE PREFERRED EMBODIMENTS

Figure 2:
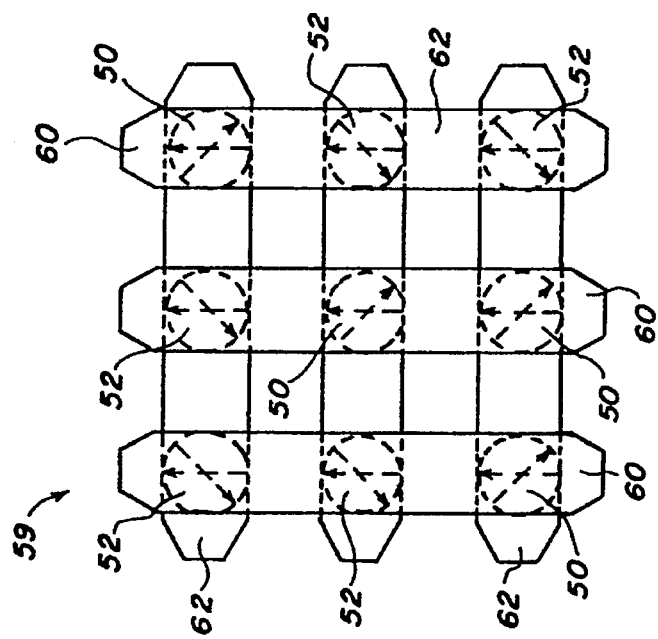
FIG. 2 is a top view of an array of non-volatile random access memory elements according to the present invention.

The carriers in devices can be identified not only as electrons and holes, but also by their spin state being "up" or "down". Just as polarized light may be easily controlled by passing it through crossed polarizers, spin polarized electron current can be created, controlled and measured by passing it between magnetic films whose relative magnetic moments can be rotated. The spin polarization manifests itself as an extra resistance in a magnetic circuit element, commonly referred to as magneto-resistance. The modern manifestation of magneto-resistance should not be confused with older observations common to semiconductors and metal in which the carriers are merely deflected by the classical Lorentz force ($\vec{V} \times \vec{B}$) in the presence of a magnetic field. This modern effect is purely quantum mechanical and occurs when two ferromagnetic metals are separated by a non-magnetic conductor. When a bias voltage causes carriers to flow from one magnetic metal into the other through the intervening conductor, the spin-polarization of the carriers can play a dominant role. The carriers leaving the first ferromagnetic metal are highly polarized because they are emitted from band states which are highly polarized. The resistance which they meet in trying to enter the second ferromagnetic layer depends strongly upon the spin polarization of the states available to them. If the ferromagnetic moments of the two magnetic metals are aligned, then the spin descriptions of the states are the same in the two materials and carriers will pass freely between them. If the two moments are anti-aligned, then the states are oppositely labeled (i.e., "up" in the first ferromagnetic layer is "down" in the second ferromagnetic layer), the carriers will find that they have fewer states to enter and will experience a higher resistance. This phenomenon is now commonly referred to as the spin-valve effect. By simply measuring the resistance between two magnetic layers, one can determine if their magnetic moments are parallel or anti-parallel.

The present invention uses this spin-valve effect as the basis of a memory element. In the memory element of the present invention, the two states, parallel and anti-parallel, represent two bits, "0" and "1". Of course, each state may be arbitrarily assigned a value of "0" or "1", provided that when the parallel state is assigned a value of "0", the antiparallel state is assigned a value of "1" and when the parallel state is assigned a value of "1", the antiparallel state is assigned a value of "0". The state of the memory element may be readily interrogated by measuring the resistance.

Most early research into the spin-valve effect measured in-plane transport and relied upon electrons being scattered between magnetic layers as the electrons propagated parallel to the magnetic layers. This non-optimum orientation has yielded changes in resistance of ΔR/R=0.45 in multilayered sandwiches at room temperatures. The latest work, and the present invention, propagate the current perpendicular to the layers (i.e., perpendicular spin-polarized transport), which maximizes the effect and yields up to an order of magnitude increase in ΔR/R. This maximization results from the elimination or reduction of the shunting effects of the non-magnetic layers in parallel transport. In parallel transport systems, as opposed to the perpendicular transport systems of the present invention, these shunting effects permit a considerable number of non-spin scattered evens to occur, thus diluting the magneto-resistance effect.

To obtain a useful magneto-resistance effect in spin-polarized systems, the polarized carrier should travel through the memory element over a time shorter than its relaxation time. The mechanisms which reverse the spin of a polarized carrier (e.g., spin-orbit scattering from defects or impurities; domain walls; interface roughness; non-uniform magnetization; and crystal structure changes), resulting in the scattering, are complex and the interactions of these mechanisms are not entirely understood. Nevertheless, it is now clear that most of the ΔR/R effects come from interfacial spin scattering rather than bulk scattering within the interior of the ferromagnetic layers. Therefore, the ferromagnetic and other layers of any memory element made according to the invention should be as thin as possible. Indeed only a thickness of only a couple of atomic layers in the ferromagnetic films layers are needed to produce the required spin polarization. Additionally, both the magnetic and non-magnetic layers should be as small as possible, which implies high purity materials in defect-free structures. This significance of defect-free structures is supported by results showing the well-matched crystal structures (Fe/Cr and Cu/Co) give larger spin-polarization effects than do unmatched systems such as Co/Ag.

The present application specifically describes two different preferred approaches for the geometry of magnetic memory elements and two-dimensional arrays which incorporate them. Although both of theses approaches depend upon the spin-valve effect, the first approach uses a sandwich structure, similar to quantum dots in semiconductor technology, while the second approach uses a planar sequence of magnetic metal stripes. The former structure is most easily fabricated using high resolution lithography, while the latter structure is most easily formed using focused ion beam milling in situ.

Figure 1:
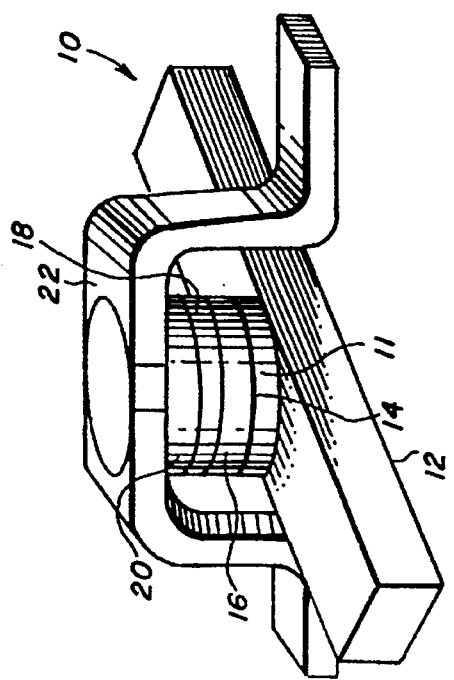
FIG. 1 shows a non-volatile random access memory element according to a preferred embodiment of the present invention.

In one approach, the magnetic memory element includes at least several vertically stacked layers. One simple example of this vertically stacked structure is shown in FIG. 1 and may be used to illustrate some of the basic concepts of the present invention. Memory element 10 in FIG. 1 includes a bottom conducting lead 12. The upper surface of bottom conducting lead 12 supports and physically contacts the lower surface of layer 11 of non-magnetic, metallic material, for example, Cu. The upper surface of nonmagnetic, conducting layer 11 supports and physically contacts layer 14 of antiferromagnetic metal (for example, FeMn). Throughout the specification and the claims that follow, it should be understood the terms "upper" and "lower" are used as terms convenience to distinguish various surfaces relative to each other. Neither "upper" nor "lower", as used in the specification and claims that follow, imply the orientation of any element with respect to the gravitational field.)

The lower surface of layer 16 of ferromagnetic metal, for example, Co, rests on and physically contacts the upper surface of the non-magnetic, conducting layer 11. Ferromagnetic layer 16 is deposited, using known and conventional poling means, so that the magnetic moment within that layer will have its preferred direction of orientation within the plane of the layer (i.e., not extending out of the layer toward adjacent layers of stack 10). Antiferromagnetic layer 14 functions to "pin" the orientation of the magnetic moment within ferromagnetic layer 16 in this preferred orientation. This pinning essentially prevents any changes in the orientation of the magnetic moment of ferromagnetic layer 16 during normal use.

The lower surface of non-magnetic layer 18 rests on and physically contacts the upper surface of ferromagnetic layer 16 and serves as the intervening, non-magnetic layer required for the spin-valve effect discussed above. The upper surface of non-magnetic layer 18 supports and physically contacts the ferromagnetic layer 20. Ferromagnetic layer 20 is deposited, using known and conventional means, including poling, so that the magnetic moment within that layer will have two preferred directions of orientation laying within the plane of the layer (i.e., not extending out of the layer toward adjacent layers of stack 10), e.g., parallel and anti-parallel with respect to the magnetic moment of ferromagnetic layer 16. The bottom surface of top conducting lead 22 rests upon and physically contacts the upper surface of ferromagnetic layer 20.

In use, applying a sufficiently large current pulse (an interrogation pulse) down the length of bottom conducting lead 12 temporarily displaces the orientation of the magnetic moment within ferromagnetic layer 20 away from its preferred orientation and either closer to or further from parallel alignment with the orientation of the magnetic moment of ferromagnetic layer 16, depending upon the original orientations of the magnetic moments of ferromagnetic layers 16 and 20 with respect to each other.

To permit reading of memory element 10, bottom conducting lead 12 is electrically biased with respect to top conducting lead 10 within a constant current circuit (a circuit which remains at constant current unless disturbed by an externally applied pulse) (not shown). The resistance between bottom conducting lead 12 and top conducting lead 10 is monitored. During this monitoring, a small current pulse (the interrogating pulse) is applied between bottom conducting lead 12 and top conducting lead 10. This interrogating pulse temporarily displaces the magnetic moment of ferromagnetic layer 20 away from its most stable orientation and alters the resistance of the stack. This bump in resistance is detected by the resistance monitoring circuitry (not shown) which measures the derivative of the slope of the resistance in the circuit. Which state (increase in resistance vs. decrease in resistance) is assigned the value of "0" and which state is assigned the value of "0" is defined in and by the electronic circuit of the device (not shown) employing memory element 10.

Figure 3:
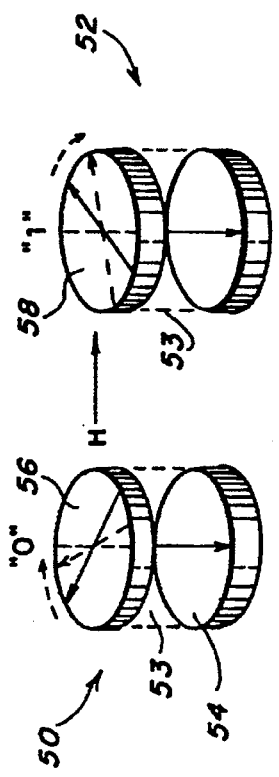
FIG. 3 shows a partial misalignment of the magnetic moments of two ferromagnetic layers in a non-volatile random access memory element according to FIG. 1.

Although the largest magnetoresistance effects would be observed for cases where the magnetic orientations of the ferromagnetic layers 16 and 18 may be either parallel (aligned) or antiparallel (antialigned) with respect to each other, for the purposes of an actually operating element, it may often be better to sacrifice some of the change in magnetoresistance for ease of fabrication and operation. For example, FIG. 3 shows the orientation of the ferromagnetic layers memory elements 50 and 52. The intervening non-ferromagnetic layers 53 are indicated by the dashed lines. As indicated by the solid arrows, the bottom ferromagnetic layers 54 of memory elements 50 and 52 both have their magnetic moments pinned in the same direction.

The top ferromagnetic layers 56 and 58 of elements 50 and 52 are both fabricated to have two preferred orientation directions for the magnetic moment. In the embodiment of FIG. 3, these orientation directions are perpendicular with respect to each other. One of these preferred orientation directions, shown by the solid arrow in layer 56, is arbitrarily assigned a value of "0". The other direction, shown by the solid arrow in layer 58, is arbitrarily assigned a value of "1". The resistance of these two orientations is the same, since the angle between the two moments is the same. However, if an interrogating current pulse is propagated down the length of the bottom conductor (see FIG. 1) of each of memory elements 50 and 52, it will generate a magnetic field perpendicular to the conductor, which will act on layers 56 and 58. This magnetic field will rotate the orientations of layers 56 and 58 in the direction indicated by the curved dotted arrows. (For the purposes of illustration, this rotation has been illustrated as clockwise, although the rotation can be made counter-clockwise by reversing the polarity of the current applied across the bottom or top conductor.

The effect of this rotation upon the magnetoresistance in memory elements 50 and 52, however, will be opposite. The magnetic moment of layer 56 rotates to the orientation indicated by the dashed arrow, which is closer to an anti-aligned state, thus increasing the magnetoresistance across element 50. On the other hand, this same clockwise rotation rotates the magnetic moment of layer 58 to the orientation indicated by the dashed arrow, which is closer to an aligned state, thus decreasing the resistance across element 50. These changes are readily measured by running a read current through the stack, which reveals the bit to be a "0" or "1".

In order to set (i.e., write) a bit in memory element 50 or 52, simultaneous current pulses are sent through the upper and lower current leads that intersect the selected element. Depending upon the polarity of the current, the resulting fields will either leave the bit as a "0" or a "1". FIG. 2 shows an array 59 of memory elements 50 and 52 in a preferred arrangement that minimizes the fringing fields from the element in order to prevent cross-talk between neighboring elements. Top conducting leads 60 and bottom conducting leads 62 define a grid pattern. Memory elements 50 and 52 are sandwiched at the points where top conducting leads 60 cross bottom conducting leads 62. Other arrangements of memory elements 50 and 52 within array 59 are possible.

Because ΔR/R effects come primarily from interfacial spin scattering, it is desirable to provide memory elements having a multilayer structure, with a maximum of interfaces being forced into a length less than the spin-relaxation length. To this end, a multilayered memory element according to the present invention includes alternating layers of hard magnetic and soft magnetic materials spaced from each other by intervening layers of nonmagnetic material. In these multilayered structures, an antiferromagnetic pinning layer may be used, but is not necessary.

Figure 4:
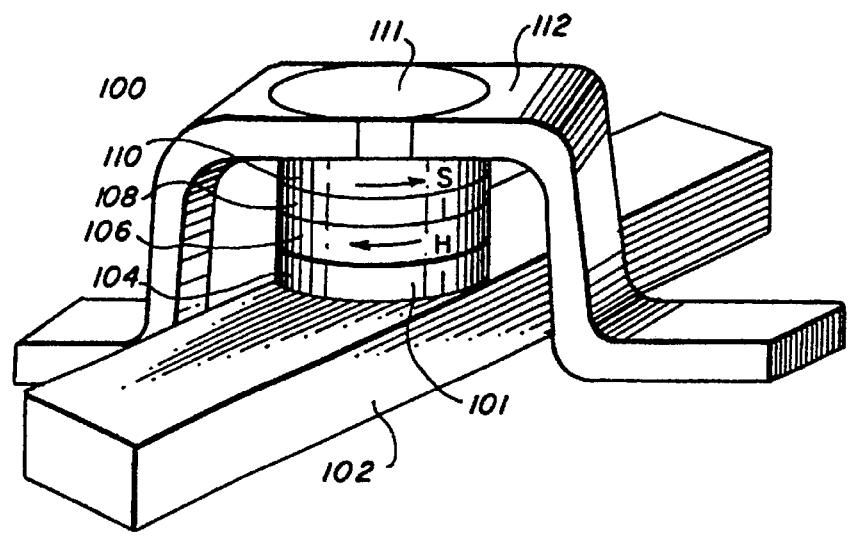
FIG. 4 shows a second embodiment of a non-volatile random access memory element according to a preferred embodiment of the present invention. This embodiment employs alternating hard and soft ferromagnetic layers.

FIG. 4 shows a memory element 100 having a plurality of interfaces which interact with spin-polarized carriers. The structure of memory element 100 is similar to the structure of memory element 10 shown in FIG. 1. Except where noted, analogous structures perform analogous function, and essentially the same considerations apply when selecting appropriate materials and dimensions. Memory element 100 includes bottom conducting lead 102. The upper surface of bottom conducting lead 102 supports and physically contacts the lower surface of layer 104 of non-magnetic material. The upper surface of optional antiferromagnetic layer 101, if present, is sandwiched between and physically contacts layer 104 of non-magnetic material and layer 106 of hard ferromagnetic metal. If optional antiferromagnetic layer 101 is absent, the lower surface of layer 106 of hard magnetic ferromagnetic metal, for example, Co, rests on and physically contacts the upper surface of the non-magnetic layer 104. Hard ferromagnetic layer 106 is deposited, using known and conventional means, so that the magnetic moment within that layer will have its preferred direction of orientation within the plane of the layer (i.e., not extending out of the layer toward adjacent layers of memory element 10).

The lower surface of non-magnetic layer 108 rests on and physically contacts the upper surface of hard ferromagnetic layer 106 and serves as the intervening, non-magnetic layer required for the spin-valve effect. The upper surface of non-magnetic layer 106 supports and physically contacts the soft ferromagnetic layer 110. Ferromagnetic layer 110 is deposited, using known and conventional means, so that the magnetic moments within that layer will have two preferred directions of orientation. These directions lie within the plane of the layer (i.e., they do not extend out of the layer toward adjacent layers of memory element 100). The bottom surface of layer 111 of conductive, non-magnetic material 112 rests upon and physically contacts the upper surface of ferromagnetic layer 110. The bottom surface of top conducting lead 112 also rests upon and physically contacts the upper surface of ferromagnetic layer 110 and physically contacts the upper surface of layer 111 of conducting, non-magnetic material.

Memory element 100 uses alternating ferromagnetic layers of two types, hard (type H, layer 106) and soft (type S, layer 110). The type H layer has a high coercive field (at least about, and preferably greater than, 100 Oe), $H_H$, i.e., magnetically hard, while the type S layer has a low coercive field (less than 100 Oe), type $H_S$, i.e., magnetically soft. Using this arrangement, one can readily switch the sandwich from an aligned to anti-aligned state by merely reversing the magnetization of the soft ferromagnetic layer 110, while leaving the magnetization direction of the hard ferromagnetic layer 106 fixed.

Figure 5A:
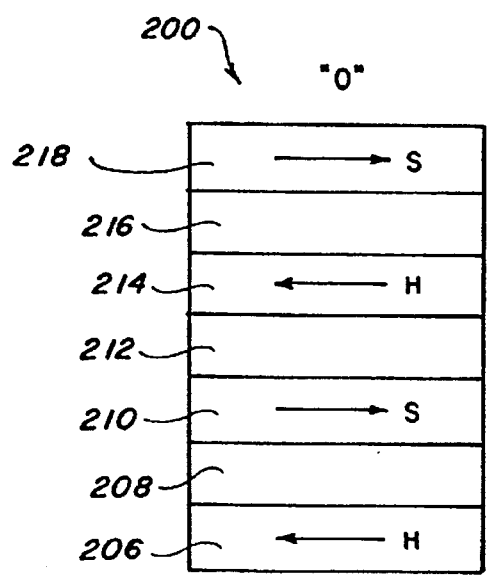
FIGS. 5a and 5b schematically shows the two "at rest" configurations of a non-volatile random access memory element according to the present invention which employs alternating hard and soft ferromagnetic layers.
Figure 5B:
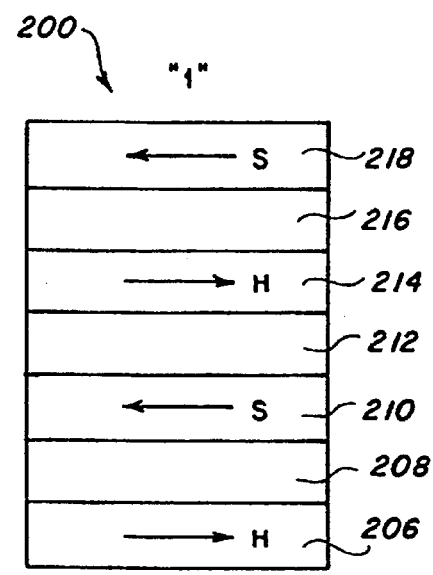

This alternating arrangement is better illustrated in the multilayer stack 200 of FIGS. 5a and 5b. Although stack 200 has more layers, it is otherwise analogous in form and function to the stack of memory element 100 in FIG. 4. Neither the top nor bottom conducting leads, nor the optional bottom, antiferromagnetic layer are shown in FIGS. 5a and 5b. The ferromagnetic layers 206, 210, 214 and 218 alternate between hard (labeled "H") and soft (labeled "S") materials. Sandwiched between each pair of hard magnetic and soft magnetic layers (204/206; 206/208; 208/210) is a layer of nonmagnetic material 212, 214, 216, respectively.

Operationally, the memory element 200 has two "at rest" configurations which arbitrarily define a "0" (FIG. 5a) and "1" bit (FIG. 5b). In the embodiment of FIGS. 5a and 8b, both of these configurations are anti-aligned ("antiferromagnetic") sequences, but with reversed phase. That is, the "0" bit has the hard layers all pointing to the left, while in the "1" bit they all point to the right. In both cases the soft layers are anti-aligned with the hard layers. In order to interrogate the stack, one merely applies a pulse field $H > H_S$ sufficient to reverse the soft layers that are oriented antiparallel to the applied pulse field. The applied pulse, is of insufficient magnitude to reverse the hard layers. This reversal will be accompanied by a resistance change $\Delta R/R$ if the applied field H is antiparallel to the soft layers, but no change if it is parallel to them. The pulsed "read" field is provided by an overlay current drive line (not shown). Fields of 10 Oe to 100 Oe, necessary for reading or switching, are readily obtained with pulses of amp peaks in existing technology.

In order to "write" a bit, the pulsed field is increased such that $H > H_H$, and the hard layers will reverse. The multilayer system will in general always revert to the anti-aligned state since it is the minimum energy state to provide flux closure of all the magnetic layers. If necessary, a lower level pulse $H_H > H > H_S$ can be provided to restore all of the soft layers without altering the hard ones.

The two anti-aligned closed magnetic circuit "at-rest" configurations shown in FIGS. 5a and 5b are extremely important in order to eliminate fringing fields from the elements. During interrogation, however, there is a momentary alignment which will generate a pulsed fringing field. The magnitude of this field will limit the closest approach of neighboring elements, hence the ultimate packing density. The most straightforward engineering solution to this problem is to provide a soft magnetic "keeper" shunt at the top of the stack above the drive line to collect the fringing field flux lines and prevent their extending out to neighboring elements. On a more sophisticated level, the stray fringing field can be reduced by lowering the magnetic moments of the layers. Thus, the soft and hard layers themselves may be fabricated as trilayer structures containing ultrathin layers of moment-carrying magnetic material. For example, others have demonstrated that FeMn, an anti-ferromagnet with no net moment, can magnetically pin an adjacent magnetic layer via exchange coupling. Since all of the spin transport effects essentially are determined by the polarization of the interfaces, the "hard" layer or layers could be composed of the sandwich (Co/FeMn/Co) or (Fe/FeMn/Fe). The polarization of the highly polarized interface layers of Co or Fe would remain fixed in direction below fields of 200 Oe. Similarly the soft layer could be formed of (Fe/FeNi/Fe) or (Co/FeNi/Co). The FeNi (permalloy) layer is very soft, easily switched, but has a small moment and would contribute little fringing field.

Figure 6:
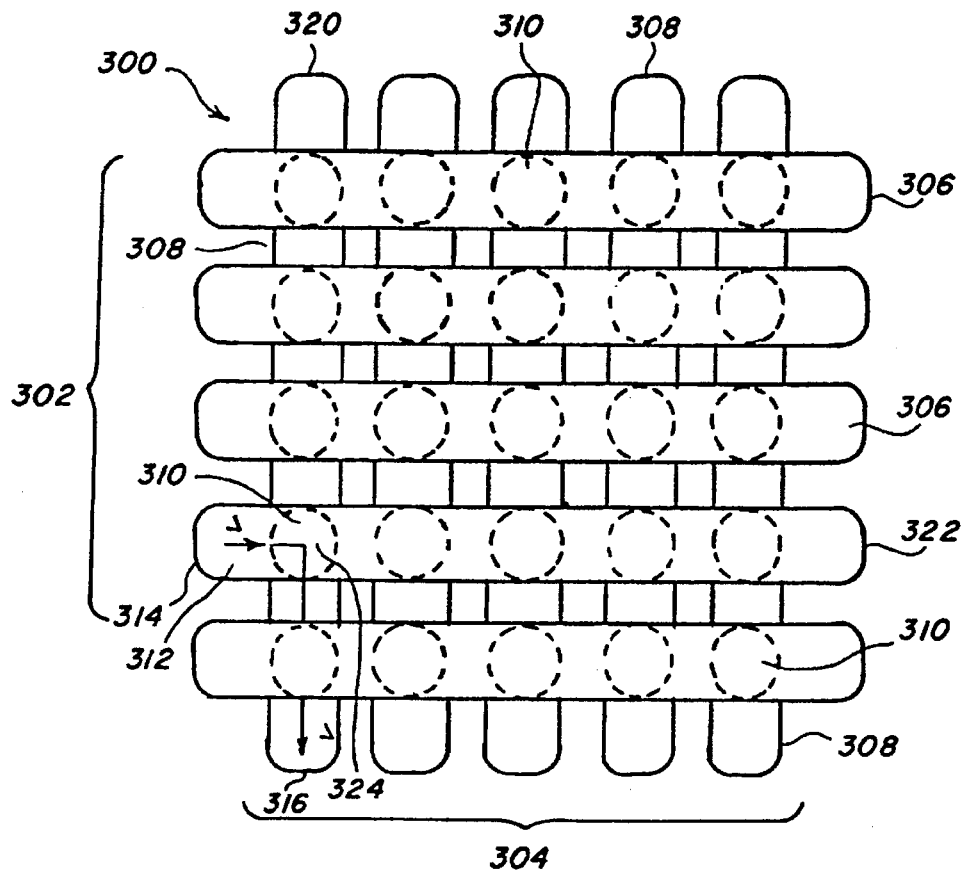
FIG. 6 is a top view of an array of non-volatile random access memory elements according to the present invention, illustrating the means for accessing and poling the memory elements in the array.

FIG. 6 shows a simplified matrix 300 consisting of two independent arrays 302, 304 of parallel current carrying bars 306 and 308. Preferably, arrays 302 and 304 are oriented about 90° to each other. Current carrying bars 306 of array 302 are above and not directly in contact with current carrying bars 308 of array 304. Current carrying bars 306, 308 from arrays 302 and 304 are connected at their intersections by the stacked memory elements 310 sandwiched between them. The interrogation current to any given element comes in one end of these bars, 306 or 308, passes through the element and passes out through an end of the other respective contacting bar 308 or 306. The other ends of bars 306 and 308 provide the leads for measurement of the potential drop, thus providing a true 4-point probe measurement which eliminates the lead resistance in the circuit. For purposes of illustration only, FIG. 6 shows interrogation current 312 (shown by the lines labelled "J", with the arrow pointing in the direction of current flow) entering through end 314, flowing through a stack 310 and exiting through end 316 of a current carrying bar 308 of array 304. Resistance is measured at ends 320, 322 of the specified current carrying bars employed in this example that oppose ends 314 and 316, respectively.

In order for the x-y matrix of FIG. 6 to give true measurements of a single element, parallel paths of conduction must be eliminated. This goal is accomplished by providing diode film elements 322 at one end of the stack where contact to the bars are made, either above or below the current bar through which the current enters the stack. This arrangement will prevent any competing currents since all currents are now forced to pass one way through the elements.

Figure 7:
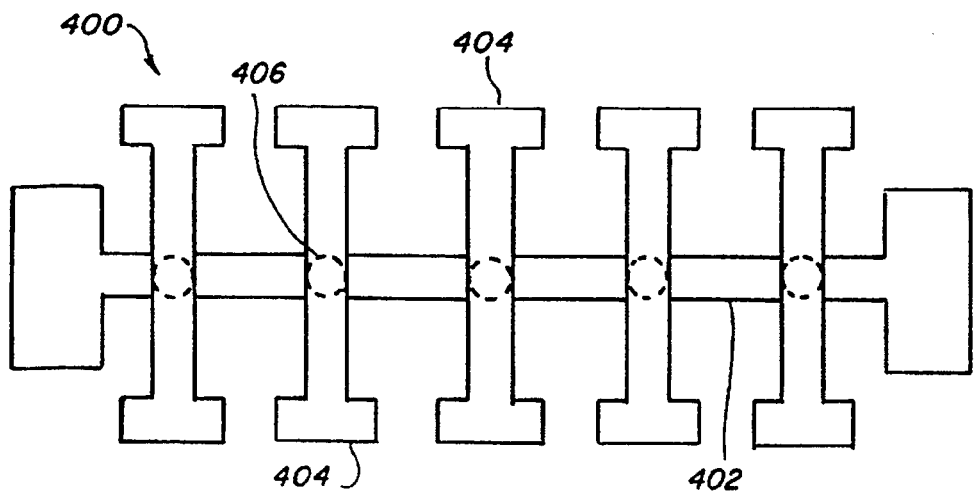
FIG. 7 is a top view of a 5-bit word tree including random access memory elements according to the present invention.

FIG. 7 shows a 5-bit word tree 400 consisting of one underlying base bar 402 crossed by five overlayer bars 404 with a stacked memory element 406 at each intersection.

Figure 8:
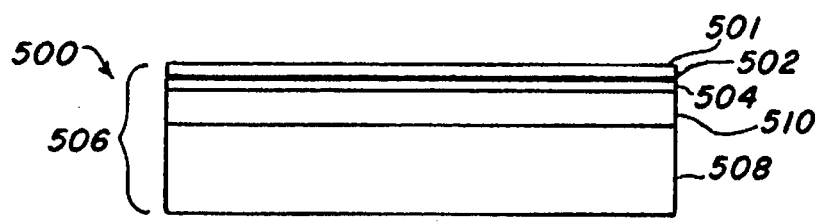
FIG. 8 shows a first step in an exemplary process for manufacturing an array of random access memory elements according to the present invention.

FIGS. 8 through 11 illustrate one exemplary method for making a memory element according to the present invention. As shown in FIG. 8, wafer 500 includes a top conductive layer 501 and magnetic multilayer structure 502 is first deposited on a thick base conducting layer 504 on an insulating substrate 506. In the embodiment of FIG. 8, insulating substrate 506 is silicon 508 on silicon oxide 510. Of course, the substrate employed is not critical to the present invention. Other insulating substrates used in the fabrication of electronic memory elements may be used.

Figure 9:
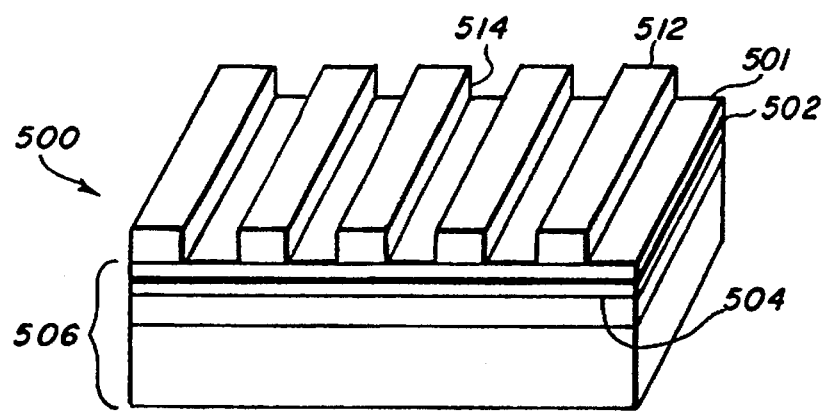
FIG. 9 shows a second step in an exemplary process for manufacturing an array of random access memory elements according to the present invention.

Next, as shown in FIG. 9, a photoresist layer 512 is deposited over top conductive layer 501 and lines 514 (typically on the order of about 1 μm thickness) are defined in the resist by conventional photolithographic methods. Then, as shown in FIG. 10, the portions of multilayer 506 exposed by lines 514 are ion milled down to insulating substrate 506 and photoresist layer 512 is removed.

Figure 10:
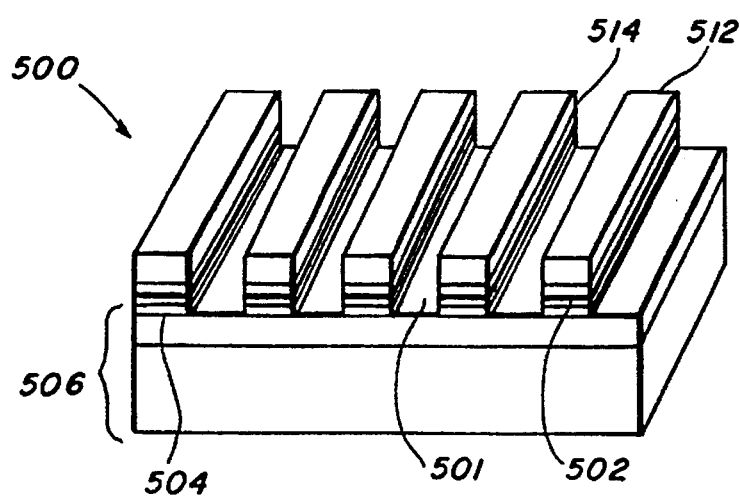
FIG. 10 shows a third step in an exemplary process for manufacturing an array of random access memory elements according to the present invention.
Figure 11:
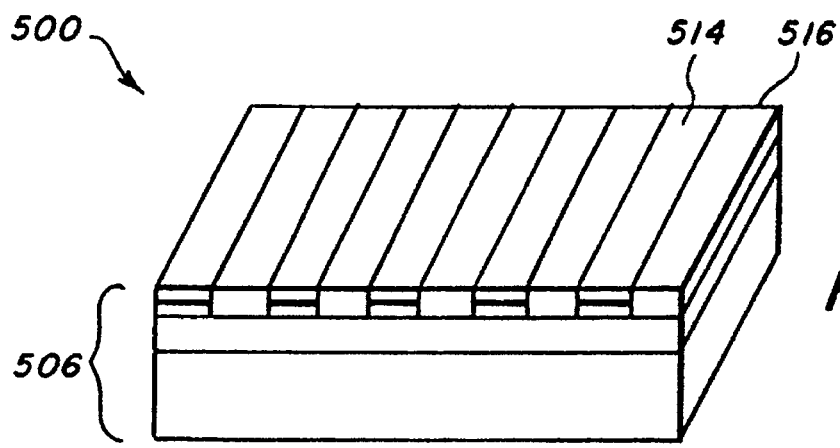
FIG. 11 shows a fourth step in an exemplary process for manufacturing an array of random access memory elements according to the present invention.
Figure 12:
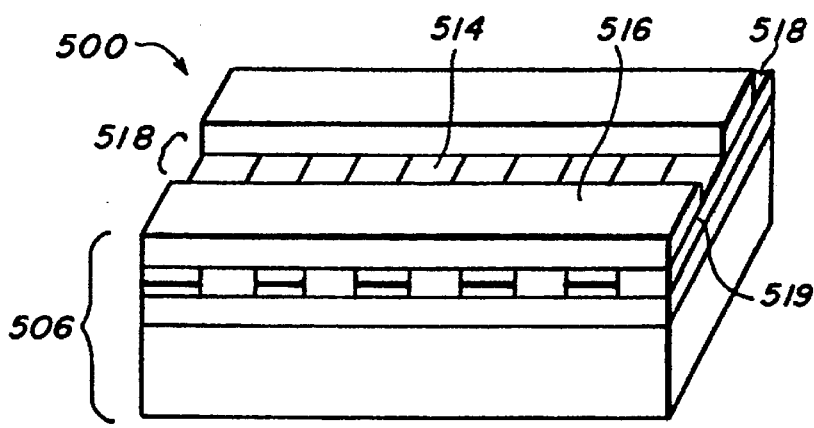
FIG. 12 shows a fifth step in an exemplary process for manufacturing an array of random access memory elements according to the present invention.
Figure 13:
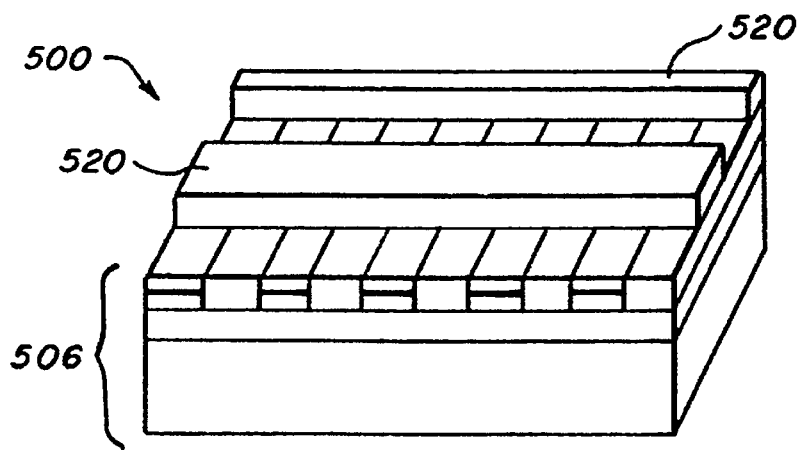
FIG. 13 shows a sixth step in an exemplary process for manufacturing an array of random access memory elements according to the present invention.

Subsequently, as shown in FIG. 11, the upper surface of assembly shown in FIG. 10 is planarized with a layer 516 of insulator, such as polyamide, SiO or SiNi. This surface is then planarized down to the surface of 514 by a suitable etching or milling technique. Layer 519 of a different photoresist material is then deposited over the planarized surface formed by the upper surfaces of metal lines 514 and insulating layer 516. Lines 518 (typically on the order of about 1 micron wide) are then defined in photoresist layer 519, perpendicular to metal lines 514 (FIG. 12). A conductive metal is then deposited, filling lines 518 with conductive metal. After photoresist layer 518 is removed, conductive metal lines 520 remain and contact the top surfaces of metal lines 514.

FIG. 14 a and FIG. 14b show a planar memory element 700 according to the present invention. In this embodiment, the conductive path lies entirely within the plane of element 700. Conducting layers 702 and 704 sandwich a multilayer structure in which ferromagnetic layers 706 and 708 sandwich a non-ferromagnetic layer 710. As with the other embodiments of the present invention, the ferromagnetic layer 706 is pinned (by exchange biasing, typically using an antiferromagnetic layer sandwiched between and in contact with layers 706 and 702 (not shown)) and the ferromagnetic layer 708 is fabricated to have two preferred directions of orientation (FIG. 14a vs. FIG. 14b). In this embodiment, only ferromagnetic layer 706 has its magnetic moment oriented perpendicular to the conductive path. The operation of the ferromagnetic memory elements of FIGS. 14a and 14b are analogous to that described for the embodiment of FIG. 1. Additionally, the planar memory element in accordance with the present invention can be adapted to use the all materials and to employ all modifications useful in the design of vertically stacked elements (for example, the use of alternating "hard" and "soft" ferromagnetic layers).

FIG. 15 shows a random access x-y array 800 of planar ferromagnetic elements 700 according to the present invention. Service line 802 contact memory elements 700 at the upper surface of conducting layer 704, while service line 804 contacts the lower surface of conducting layer 702. The diagonal array of elements minimizes the overlap of service lines 802 and 804.

Service lines 802 and 804 and conductors 702 and 704 may be readily manufactured by routine making and deposition processes. The multilayer structure including layers 706, 708 closely separated by layer 710 must be fabricated by a technique which will provide contamination free interfaces, for example, in-vacuum processing.

FIGS. 16a, 16b, 16c and 16d show an in-vacuum line process useful for making the arrays of planar magnetic memory elements shown in FIG. 15. After preparing the lattice of service lines (only line 802 is shown in FIGS. 16a–16d) upon an insulating substrate 804, one is left with conducting pads 806 (typically Cu) upon which the striped memory element will be constructed. Wafer 900 is totally covered with photoresist layer 902 and placed in a vacuum chamber (not shown). The locations, trenches 904 and 908, of ferromagnetic strips 704 and 706, respectively, are selectively milled away down to top surface substrate 804 or below with a focused ion beam (FIG. 16b). As shown in FIG. 16c, ferromagnetic metal (e.g., Co) layer 904 is carefully deposited to completely fill trenches 906 and 908 in order to make good electrical contact to the exposed Cu walls 702a and 704a. Wafer 900 is removed from the vacuum chamber and photoresist layer 902 is removed, thus removing the excess ferromagnetic metal from layer 904 and leaving the striped memory element 700.

Figure 17:
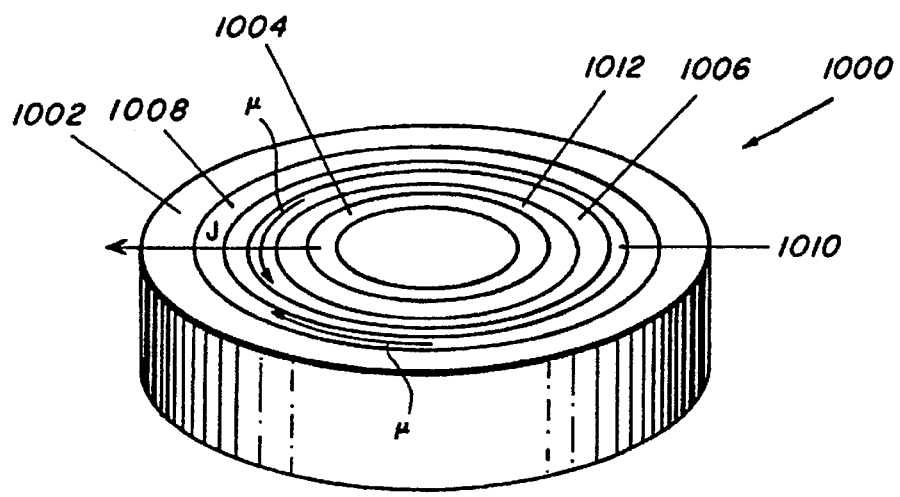
FIG. 17. is a planar view of another embodiment of a non-volatile ferromagnetic memory element according to the present invention.

A ferromagnetic random access memory element according to the present invention may also be realized utilizing an annular configuration, as shown in FIG. 17. In one annular configuration 1000, the outermost ring 1002 is a conductive, nonmagnetic metal. A conductive layer or line 1004 (e.g., solid rod, hollow tube, annular ring, or solid dot) is positioned at the center of the annulus. Pairs of ferromagnetic layers 1006, 1008, each pair sandwiching a conductive, nonmagnetic metal layer 1010, reside between the outermost layer 1002 and innermost layer or line 1004. Each ferromagnetic layer 1006, 1008 is poled so that the easy axis of its magnetic moment μ is oriented to be either clockwise or counterclockwise. In order to pin the magnetic moment of the outermost ferromagnetic layer, an antiferromagnetic layer 1112 may be positioned between the outermost conductive layer and the outermost ferromagnetic layer. In this arrangement, the resistance of the element to the radial current flow J the would depend upon whether the magnetic moments μ of the ferromagnetic layers 1006, 1008 are all oriented in the same direction (either clockwise or counterclockwise), i.e., aligned, or whether the magnetic moments μ of the ferromagnetic layers 1006, 1008 alternate sequentially between clockwise and counterclockwise and counterclockwise orientations, i.e, anti-aligned, as shown.

Figure 18:
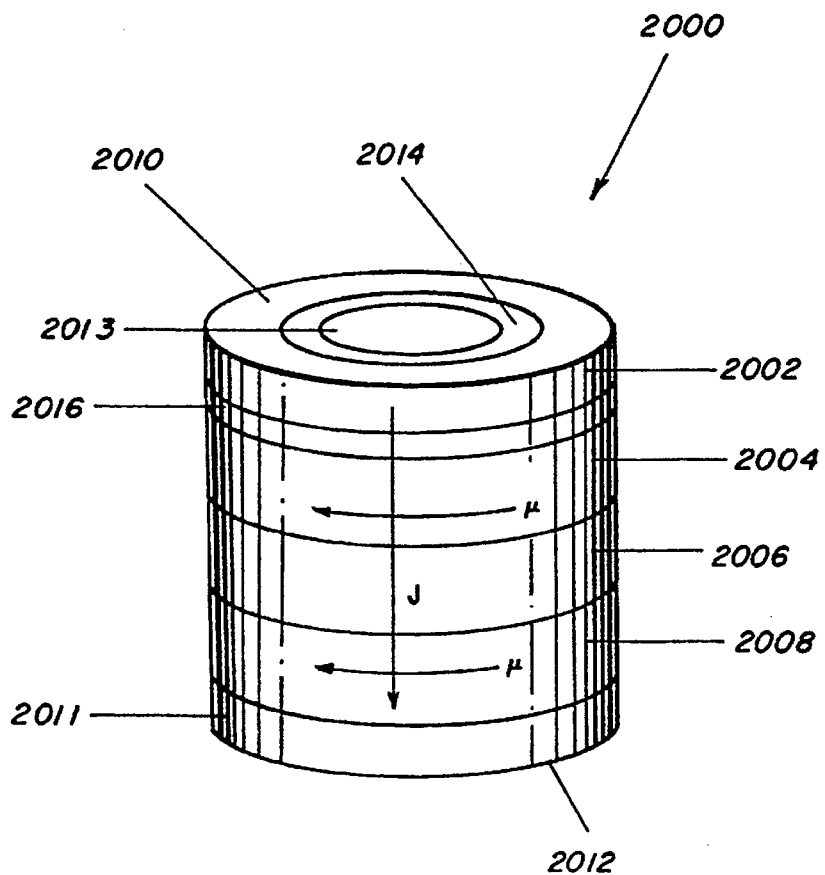
FIG. 18 is a planar view of yet another embodiment of a non-volatile ferromagnetic memory element according to the present invention.

In another annular configuration (FIG. 18), the memory element is composed of a stack 2000 of rings 2002 (nonmagnetic metal), 2004 (ferromagnetic, magnetic moment μ as shown by arrow), 2006 (nonmagnetic metal), 2008 (ferromagnetic, magnetic moment μ as shown by arrow), 2011 (nonmagnetic metal), the ferromagnetic layers 2004 and 2008 having the same (as shown) or alternating directions of magnetization, analogous to FIG. 4, with electrical contacts 2010, 2012 at the top and bottom of stack 2000 for interrogating the magnetoresistance of the stack. The center of the stack, however, has been replaced by a conducting "rod" 2013, which is insulated from the stack elements themselves by insulating layer 2014. If needed or desired, antiferromagnetic layer 2016 is sandwiched between nonmagnetic layer 2002 and ferromagnetic layer 2004. Current flow J is axial through the stack elements.

In both of the annular configurations described above, the magnetic elements are constructed to be closed magnetic circuits, either hollow cylinders in the first configuration, or hollow washers in the second configuration. These closed magnetic circuits have no fringing fields and therefore permit adjacent memory elements to be packed very densely. In both cases, in order to "write" information in an element, the magnetic flux must be generated in a circular pattern either parallel or anti-parallel to the flux in the annular magnetic components. One way to do this is via the center electrical conductor, 1004 or 2013. Of course, other techniques may be realized to achieve this operation.

The ferromagnetic metal layers according to the present invention may be made of any ferromagnetic material. For example, the ferromagnetic layer may be Fe, Co, Ni or an alloy thereof (including permalloy and the magnetic alloys described in U.S. Pat. Nos. 4,402,770 and 4,402,043, both to Norman C. Koon, and both incorporated herein in their entireties). The non-ferromagnetic layer may be any electrically conductive, non-ferromagnetic metal, e.g., Cu, Pt, Ag, Au and alloys thereof. If hard and soft ferromagnetic layers are used, the hard magnetic material may be, for example, Co, Fe or an alloy thereof (including the hard, supermagnetic alloys described in U.S. Pat. No. 4,402,770 to Norman C. Koon) while the soft magnetic material may be, for example, Ni, Fe, Co and alloys thereof (including permalloy and the soft magnetic materials described in U.S. Pat. No. 4,409,043 to Norman C. Koon). The antiferromagnetic layer, if used, may be, for example, Cr, Mn or an alloy thereof, e.g., FeMn or a rare-earth-containing material.

Typically, the ferromagnetic layers used in the present invention have a thickness of from about 10 Å to about 100 Å, preferably about 50 Å to about 100 Å for ease of fabrication. Similarly, the non-ferromagnetic layers used in the present invention have a typical thickness of from 10 Å to about 100 Å, preferably about 50 Å to about 100 Å for ease of fabrication.

In the fabrication techniques described above, the photoresist material and insulating layers used are not particularly critical. Any photoresist materials and any insulating materials commonly used in electronics fabrication should be useful in these fabrication techniques.

Other details concerning the present invention may be found in the present inventors copending U.S. patent application entitle MAGNETORESISTIVE LINEAR DISPLACEMENT SENSOR, ANGULAR DISPLACEMENT SENSOR, AND VARIABLE RESISTOR, filed on even date herewith, Ser. No 08/130,480, based upon Navy Case No. 75,407. The entirety of that copending application is incorporated herein by reference, for all purposes.

Obviously, many modifications and variations of the present invention are possible in light of the above teachings. It is therefore to be understood that, within the scope of the appended claims, the invention may be practiced otherwise than as specifically described.

What is claimed is:

1. A method of fabricating a non-volatile ferromagnetic random access memory element, comprising the steps of:

depositing a multilayered structure including:

a first ferromagnetic layer and a second ferromagnetic layer, said first ferromagnetic layer having a magnetic moment that is co-planar with said first ferromagnetic layer, said second ferromagnetic layer having a magnetic moment and two preferred axes of magnetic orientation for said magnetic moment of said second ferromagnetic layer, wherein one of said preferred axes of magnetic orientation is closer to a parallel alignment with said magnetic moment of said first ferromagnetic layer than is said other of said preferred axes of magnetic orientation;

a non-magnetic metallic layer sandwiched between said first and second ferromagnetic layers;

a first end conducting layer defining an upper end surface of said multilayered structure; and a second end conducting layer defining a lower end surface of said multilayered structure, onto an upper surface of an insulating substrate;

depositing a first photoresist layer over an upper surface of said multilayered structure;

photolithographically defining a first set of lines in said first photoresist layer;

selectively removing portions of said first photoresist layer defined by said lines to expose corresponding portions of said upper surface of said insulating substrate;

removing said first photoresist layer to provide an assembly having an upper surface of lines of said multilayered structure upon said upper surface of said insulating substrate;

depositing an insulating layer to planarize said upper surface of said assembly;

depositing a second photoresist layer upon said planarized surface;

photolithographically defining lines in said second photoresist layer, said lines in said second photoresist layer traversing said lines of said multilayered structure;

depositing a layer of conductive metal over said second photoresist layer to fill said lines in said second photoresist layer;

removing said second photoresist layer.

2. The method of claim 1, wherein said portions of first photoresist layer are selectively removed by ion-milling.

3. The method of claim 1, wherein said first and second ferromagnetic layers comprise Fe, Co or Ni.

4. The method of claim 1, wherein one of said first and second ferromagnetic layers is a hard ferromagnetic metal and the other of said first and second ferromagnetic layers is a soft ferromagnetic metal.

5. The method of claim 4, wherein said hard magnetic metal has coercive field of at least 100 Oe and said soft magnetic metal has a coercive field of less than 100 Oe.

* * * * *